United States Patent [19]

Zimmerman

[11] Patent Number: 5,103,085

[45] Date of Patent: Apr. 7, 1992

[54] PHOTOELECTRIC PROXIMITY DETECTOR AND SWITCH

[76] Inventor: Thomas G. Zimmerman, 644 10th Ave., San Francisco, Calif. 94118

[21] Appl. No.: 577,934

[22] Filed: Sep. 5, 1990

[51] Int. Cl.⁵ .............................................. G06M 7/00
[52] U.S. Cl. ................................. 250/221; 250/214 B
[58] Field of Search ............... 250/221, 222.1, 227.22, 250/214 R, 214 A, 214 B; 341/31

[56] References Cited

U.S. PATENT DOCUMENTS

| | | | |
|---|---|---|---|
| 3,340,401 | 9/1967 | Young | 341/31 |
| 3,621,268 | 11/1971 | Neckarhausen et al. | 250/222.1 |
| 3,937,952 | 2/1976 | Ripley et al. | 250/227.22 |
| 4,068,222 | 1/1978 | Treviranus | 250/221 |
| 4,306,147 | 12/1981 | Fukuyama et al. | 250/221 |
| 4,340,813 | 7/1982 | Sauer | 250/221 |
| 4,724,312 | 2/1988 | Snaper | 250/221 |
| 4,879,461 | 11/1989 | Philipp | 250/221 |

OTHER PUBLICATIONS

"Application Considerations for All-Material Proximity Sensors" Micro Switch, A Honeywell Division PK 8287 1 (not dated).
"Triple Beam Range Measurement Photoelectric Sensor" Aromat (not dated).

Primary Examiner—David C. Nelms
Assistant Examiner—Que T. Le
Attorney, Agent, or Firm—Thomas M. Freiburger

[57] ABSTRACT

A reflection-type photoelectric proximity detector and switch is capable of detecting the incremental and binary proximity of a finger through several layers of glass, cancelling out extraneous reflections and stray sources of radiation. The circuitry includes a modulated infrared emitter, an infrared detector, an optical barrier, an infrared filter, a bandpass filter, a signal rectifier, a biasing circuit to remove unwanted detected modulated signal, an amplifier, an incremental proximity output, a comparator, a detection reference, and a binary proximity detect output. In one embodiment a multitude of photoelectric proximity switches are installed on the inside of a store window, detect finger proximity from outside the window, and control electric appliances inside the store window. From outside the window, a user can select what is displayed inside the window.

28 Claims, 5 Drawing Sheets

PHOTOELECTRIC PROXIMITY DETECTOR AND SWITCH

BACKGROUND OF THE INVENTION

This invention relates to proximity detectors and switches, and in one embodiment it is concerned with a touch detector for mounting inside a store window, enabling a user outside the window to control appliances and/or displays inside the store.

A number of different types of proximity detectors and switches have been in use or disclosed. Switch panels that use the reflection of infrared radiation to detect finger touch are disclosed in Sauer's U.S. Pat. No. 4,340,813. Short range reflective controls such as Micro Switch (a division of Honeywell) Model FE7B use the reflection of modulated infrared radiation to detect objects. Fukuyama et al. U.S. Pat. No. 4,306,147 discloses a reflection-type photoelectric switching apparatus which detects the presence of an object in a mechanically adjustable sensing area. Aromat (a member of Matsushita Group) Model MQ-W3A-DC12-24V photoelectric sensor detects the presence of an object in an electrically adjustable sensing area using optical triangulation.

Philipp U.S. Pat. No. 4,879,461 discloses a reflective-type detection system which senses the presence of an object against a background using a general technique of nulling to negate the effects of stray (e.g. ambient) light by adding the complement of the detected signal to a summing point in the circuit to cancel the signal generated by stray light. In a system using a modulated emitter, this requires the generation of an amplitude and phase regulated modulated signal as a complementing signal. As explained below in the present system a filtered and rectified version of a detected signal is nulled with a constant (DC) level signal.

Reflecting-type infrared switches use the reflection of infrared light off an object to detect the presence of the object. Such sensors are in common use in industry to detect the presence of an object without having mechanical contact with the object, leaving the object undisturbed. These sensors lack mechanical contacts which wear and soil, giving them long lifetimes.

Reflective-type infrared switches have the potential to detect finger proximity through glass. A preferred application of a reflecting-type infrared switch is a touch switch that allows the control of electric devices located inside a store window from outside. Locating all system components inside the store window affords them safety from the elements of weather and vandals and eliminates the need to drill through building walls and glass. The operation of electric devices could occur during or after store hours.

Detecting finger proximity through one or more glass panes that might include air gaps in an environment that can include a multitude of radiation sources and reflections increases the difficulty of the task. Reflective-type infrared switches that use modulated emitters and infrared and electronic filters minimize the effect of extraneous radiation outside the bandwidth of the infrared and modulation frequencies. Extraneous radiation sources would include sunlight, artificial window and street lighting, and automobile headlights.

A common detection practice used to detect the presence of an object with a reflecting-type infrared switch using a modulated emitter is to optically and electronically filter the reflected signal and compare it to a threshold which is applied against a composite signal which may include reflections from other objects in the sensing region.

This technique does not take into account the presence and effect of large extraneous reflections which can occur in the preferred window application described above. The present invention addresses this situation by including a means of applying a threshold to an amplified version of the detection signal after the extraneous steady-state signal has been cancelled.

Another detection practice used by Fukuyama and Aromat adjusts the sensing area to exclude extraneous objects from a detection range. This is not adequate in the preferred application since extraneous objects (glass panes) are in intimate proximity to the object to be detected (finger).

Proximity detectors are used in industry to measure, for example, the web tension and accumulating roll diameter of winding fabric, proximity of microprobes from the surface of electronic parts, product width or position determination, and distance measuring on automatic vehicles. Typically ultrasonics are used in applications that resolve within a centimeter. A reflective-type proximity detector offers the possibility of measuring displacement to a much finer resolution, albeit over a much shorter working distance, typically under 30 centimeters.

Reflecting-type infrared proximity detectors operate on principles similar to reflective-type proximity switches, having instead an analog signal output indicating the strength of the reflected signal, which increases as the object gets closer to the detector. One difficulty encountered by reflective-type proximity detectors is the tradeoff of sensitivity to incremental movements and saturation from total reflection. This situation is similar to the case of the reflecting-type infrared switch where there is a small change in reflection (due to incremental movement) in the presence of a large background reflection (due to total reflection).

It is therefore a purpose of the invention to create a reflective-type proximity switch that can detect the touch of a human finger, discriminated from stray radiation in a multitude of environments including the preferred application mentioned above. It is a further purpose of the invention to produce an output which is relative and which increases as an object comes closer to the detector, removing the effect of total reflection to allow greater amplification of incremental movement.

SUMMARY OF THE INVENTION

In accordance with the present invention, a proximity detector and switch is relatively simple in construction and circuitry, and highly accurate and sensitive in use. The principal circuitry can be used for detecting presence of an object to produce a binary output, i.e. as a switch, or a continuous output for determining the proximity of an object.

A principal object of the invention is to provide a relatively simple and cost efficient system having a means of removing the effect of large background type or steady-state reflections to allow greater amplification of changes in reflection. A related object is to detect small incremental changes of reflection in the presence of large steady-state reception which may be from reflection or direct transmission or both.

Another object of the invention is to produce an output that increases and decreases as an object incrementally moves respectively closer to and farther away from the detector.

Another object of the invention is to provide a reflective-type proximity switch capable of binarily detecting finger proximity.

Another object of the invention is to produce a binary output that indicates when an object to be detected is within a zone of proximity.

A further object of the invention is to detect finger presence or proximity through one or more panes of glass that may include an air gap, by cancelling out the radiation reflected by the glass.

Another object of the invention is to provide visual feedback to indicate the switch state of a touch sensitive switch.

Another object of the invention is to provide a simple means to calibrate the switch during installation.

Another object of the invention is to control electric devices with a photoelectric proximity switch, and particularly to allow a user outside a window to control displays of information or other visual material inside the window.

Another object of the invention is to provide a system which will permit a computer or modem to control visual feedback to indicate when to touch the switch.

Another object of the invention is to prevent unintended touches or objects moving past the switch from activating the output of the switch.

Another object of the invention is to include several touch switches, serial communication with a computer, touch response delay, relays to control electric devices with the touch switches, visual feedback to indicate switch state, calibration state, and where and when to touch the switch, in a self contained system.

To achieve an output indicating proximity of an object, a photoelectric proximity detector according to the invention includes a means for transmitting a modulated infrared beam, means for mechanically blocking stray radiation, means for optically selecting radiation in the spectral band of the transmitted beam, means for converting a received infrared modulated beam into an electric signal, means for electrically selecting signals at the modulation frequency, and means for electronically converting the modulation signal into a proximity level. The system further includes means for electronically compensating for extraneous steady-state infrared modulated radiation picked up by the detector, and means for electronically amplifying the compensated proximity level.

To further achieve the goal of a photoelectric proximity switch or touch switch, the following elements are added to the photoelectric proximity detector described above: a means for electronically converting the compensated proximity level into a binary proximity state, and means for electronically delaying the binary proximity output by an adjustable delay. The system thus produces a signal which can be used for touch detection, for communicating the binary proximity state to electric devices, computers and modems. These may be used to control displays of information, thus giving a user control of the displays by touch selection.

In one preferred embodiment of the invention, an array of infrared light emitting diodes (IRLEDs) emit a beam of pulse modulated infrared radiation outwardly toward a sensing area. The IRLEDs are modulated together to produce a single-phase beam from the array. The beam is reflected off objects in the sensing area, and this reflected radiation is received and converted into an electric signal by an infrared phototransistor (IRPT). The IRPT preferably includes an infrared filter integral in its construction, to optically block out-of-band radiation. An opaque tube is fitted around the IRPT to mechanically block off-axis stray radiation, effectively narrowing the sensing area.

The signal from the IRPT goes through a bandpass filter which electronically selects signals at the modulation frequency, and a half wave rectifying circuit converts this AC signal into a DC proximity level. An important feature of the invention is that, after the described processing to produce a DC proximity level, a bias signal is subtracted from the proximity level to compensate for extraneous steady-state modulated radiation. This can be from glass surfaces, for example, in a through-the-window touch detector.

The compensated proximity level signal can be amplified and the result output as a proximity signal of the detector device. It can also be used to produce a binary output, to operate as a switch.

To implement the device as a photoelectric proximity switch or touch detector, the amplified compensated proximity level signal is converted into a binary output by comparison to a detection threshold. The comparison is made with hysteresis to prevent a jittery output when the two signals are near in value. In a preferred implementation, the binary output of the comparison is delayed using a charging circuit to ignore quick unintended touches caused for example by a finger brushing over the photoelectric proximity switch.

In the specific embodiment of a touch detector, such as for enabling a user outside a store window to make touch selections to operate display equipment inside the store window, visual indications and visual feedback to the user are desirable. To this end, the proximity detector and switch of the invention includes a visual means for indicating the location of the touch area, a further visual indication of the switch output, and a request for switch touch.

In a preferred embodiment of the invention, the touch area or touch areas are indicated by illuminated light conducting acrylic target rings which circumscribe the IRLED arrays and the IRPT at each touch sensor, thereby circumscribing the touch area with a ring of light. This target ring preferably flashes to request a touch and to indicate that switch is detecting touch.

For calibration of the touch sensor or proximity device, i.e. to adjust the magnitude of the biasing signal which subtracts out steady-state extraneous signal detected by the detector, a bicolored LED is used to indicate the bias state, which is the sign of the relative magnitude of the compensation level as compared to the proximity level (without presence of a finger or other object to be detected) before the summation of the two levels is performed. Upon installation of a touch detector, an installer adjusts the magnitude of the biasing signal to equal the magnitude of the uncompensated proximity level by observing the bicolored LED, which illuminates green when the bias signal is greater than the proximity level, red when the bias signal is less than the proximity level, and extinguishes when the bias signal is equal to the proximity level. Once the bias signal is set, the sensitivity of the touch switch is adjusted by setting the gain of the amplifier, which amplifies the compensated proximity level signal, so as to produce a detection output when the object to be detected is in proximity to the touch sensor.

To carry out the purpose of communication with a user, such as in the environment of a store window, the proximity switch of the invention includes a means for relaying the switch state to electrical devices including a computer connected to a display device, and optionally including a modem. The display generated by the computer, in response to touch selections of the user, provides part of the visual feedback to the user. Thus, in addition to flashing illuminated target rings, a request for user selection can also be made by the display of information generated by a computer, such as a textual message. Similarly, confirmation of user selection by the flashing of the target ring of the particular switch touched, while all remaining unselected switches revert to steady illumination of their target rings, can also be indicated by the computer display—for example, by graphically highlighting what has been selected.

In preferred embodiments of the invention the binary switch state output of a touch switch can drive a relay that can turn on other electrical devices in response to the user's touch selection. Examples are video disk players, toy trucks, fans and light bulbs, as alternatives to strictly displaying information on a screen as described above.

A serial communication device can be included to enable a computer to interrogate the state of each touch sensitive switch, arm and reset a latch that stores the photoelectric proximity switch's touch state, and control the flashing of the target rings. Multiple switch panels, each containing a plurality of touch switches, can be in communication with one computer through a serial communication scheme wherein each unit is given a unique address and only responds to commands that contain its address. Modem communication is achieved through use of a serial interface that connects to a telephone line.

DESCRIPTION OF PREFERRED EMBODIMENTS

Figures 1A, 1B:
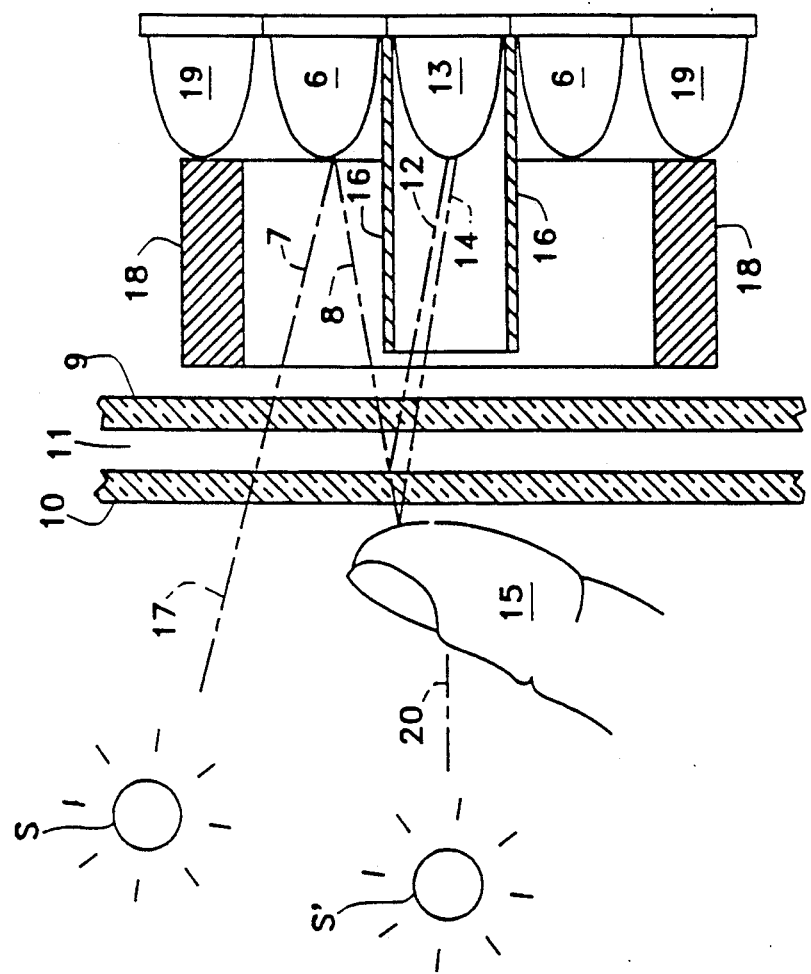
FIG. 1A is a front view of an optical assembly of a photoelectric proximity detector and switch in accordance with the invention.
FIG. 1B is a cross sectional view of the optical assembly shown in FIG. 1A.

FIGS. 1A and 1B show optical assembly components of the photoelectric proximity detector and switch 5 of the invention. An array of IRLEDs 6 transmit modulated infrared light in beams represented by lines 7 and 8 through a plurality of glass panes 9 and 10 which include an air gap 11. Such insulated double-pane glass is often used in store windows. As indicated by a line 12, some of the beam reflects back into an infrared phototransistor (IRPT) 13 by reflection off glass surfaces (which can include both inner and outer surfaces). Some of the beam, as indicated at 14, is reflected back into the IRPT 13 by a finger 15 in proximity to the top or outer glass pane 10. The IRPT 13 is furnished with a black IR filter package (not shown). An opaque tube 16 preferably is included to sheath or shroud the IRPT 13, thus restricting the acceptance angle of the IRPT 13 and minimizing the detection of off-axis illumination such as represented by a ray 17 from the sun S. Even if the sun's rays are filtered out of the system by the IR filter and by electrical components described below, the IR component of the sun's spectrum that passes through the IR filter can be strong enough to saturate the detector 13 and thus prevent good readings If the sun were in a position S' substantially aligned with the axis of the IRPT 13, allowing enough of the sun's rays 20 to pass axially through the opaque tube 16 and saturate the IRPT 13, the finger 15 would interrupt these rays 20, allowing the detection of the finger 15.

A light conductive target ring 18 in one preferred embodiment, which may be made of acrylic, is illuminated by an outer array of a plurality of visible LEDs 19, emitting constant or blinking light to indicate the status of the photoelectric proximity switch 5.

Figure 2:
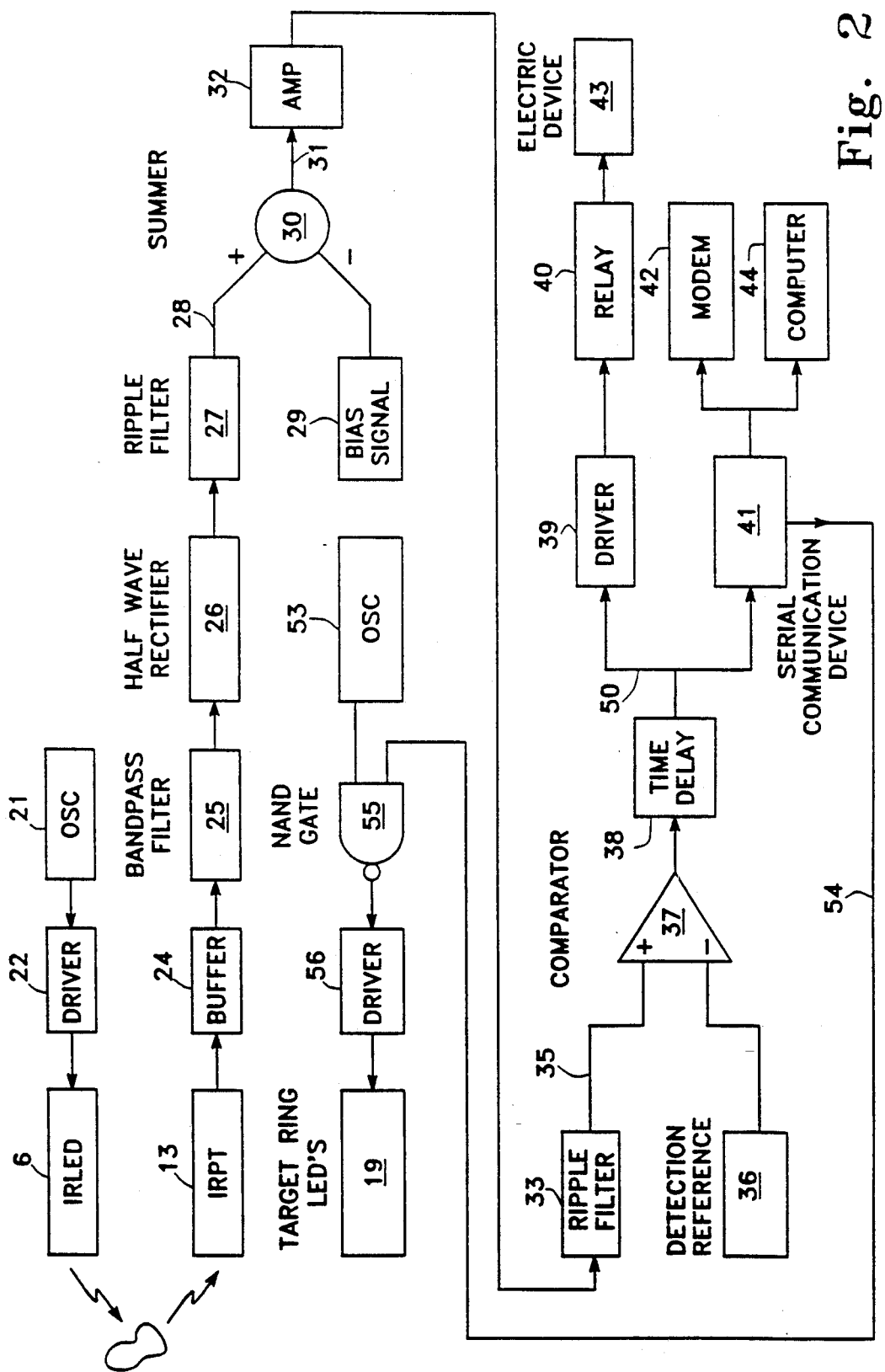
FIG. 2 is a block diagram indicating a preferred implementation of circuitry for the device of the invention, with outputs for both compensated proximity detection level and for binary switch functions.

FIG. 2 is a block diagram showing the signal processing used in a preferred embodiment of the photoelectric proximity detector and switch. An oscillator 21, typically 1 Khz, drives a plurality of IRLEDs 6 through a drive circuit 22. An infrared phototransistor (IRPT) 13 converts reflected (and in some cases scattered and direct-transmitted) infrared radiation into an electric signal that is buffered at 24 and filtered by a bandpass filter 25 with a center frequency of the modulation oscillator 21. The bandpass filtered signal is half-wave rectified at 26 and ripple filtered at 27 to produce a proximity signal 28 proportional to the amplitude of the modulated infrared radiation received by IRPT 13.

A bias signal 29 is subtracted from the proximity signal 28 by a summing circuit 30. This has the effect of cancelling out any steady-state extraneous signals caused by reflections, scattering and direct path leaks between the IRLEDs 6 and the IRPT 13. The resulting biased signal at 31 is amplified by an amplifier 32 and then further ripple filtered at 33, producing a compensated analog proximity signal 35 that indicates the incremental proximity of an object 45 (which can be the finger 15) in the field of view common to the IRPT 13 and IRLEDs 6. The signal 35 can be fed to an appropriate form of readout, or its value can be used to control electric devices or displays as desired.

If the system of the invention is to function as a touch switch or object-present switch, components 36–43 in FIG. 2 are used to implement this.

When the compensated proximity signal 35 is greater than a detection reference 36, the output of a comparator 37 goes high, starting a time delay 38. If the output of the comparator 37 remains high for the duration of the time delay's period, the time delay 38, at the end of the time delay period, turns on a relay 40 through a relay driver 39, to control an electric device 43 (e.g. a video disk player and connected display). If the comparator 37 output falls before the completion of the time delay period, the time delay 38 resets and does not produce an output. In a preferred embodiment a serial communication device 41 transmits the time delay's output 50 to a computer 44 and modem 42. The computer 44 through the serial communication device 41 controls the flashing of the target ring LEDs 19 though a control line 54 by allowing the output of a low frequency oscillator 53 to pass through a NAND 55 and into a driver 56. Thus, the target ring LEDs 19 are on or flashing when the control line 54 is respectively low or high.

Figure 3:
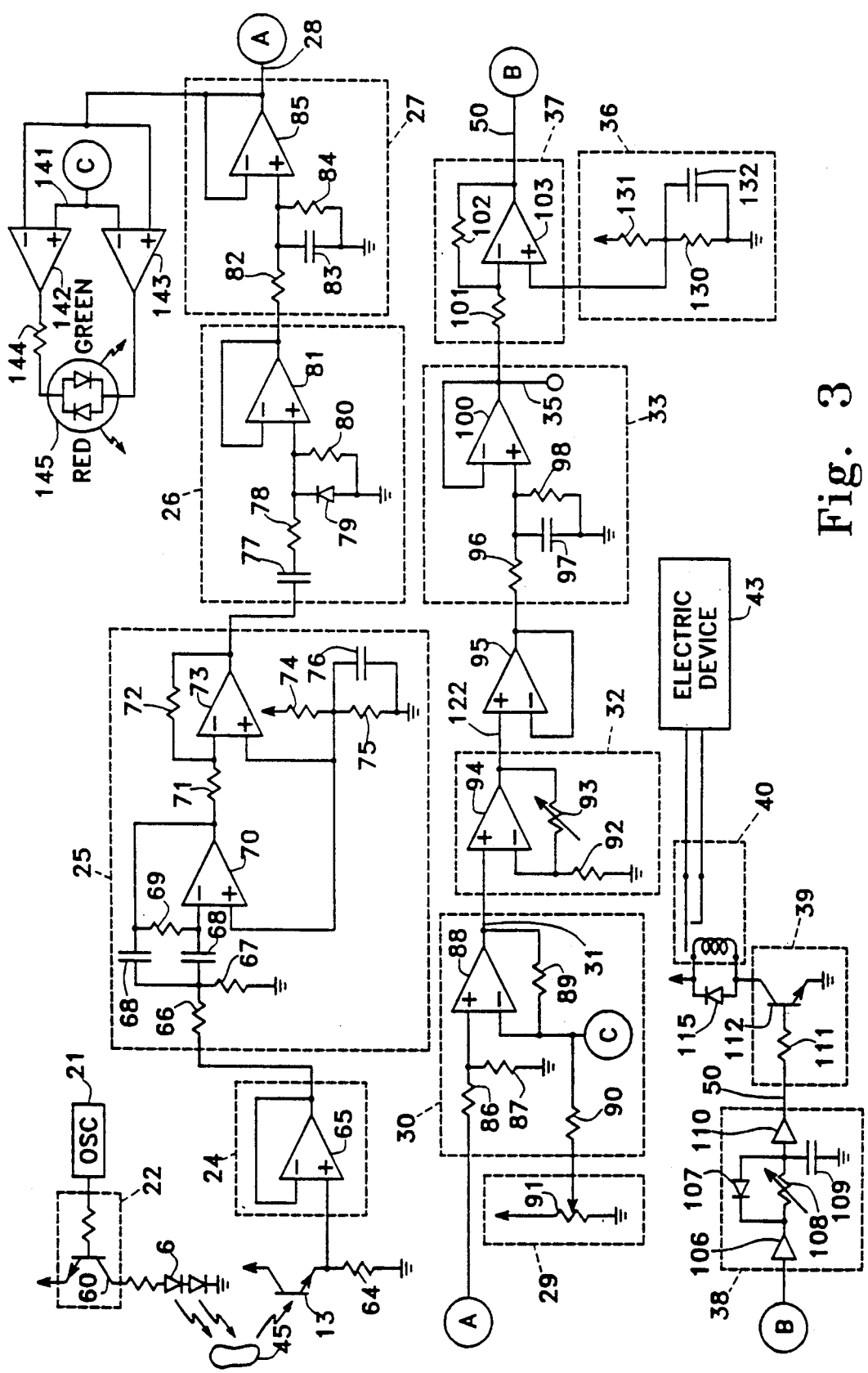
FIG. 3 is a schematic circuit diagram representing one embodiment of the proximity detector and switch of the invention.

FIG. 3 is a circuit schematic showing one possible implementation of the photoelectric proximity detector and system. It should be understood that this schematic is merely an example of an implementation of the functions of the block elements of FIG. 2. This implementation uses discrete parts and operational amplifiers to implement block elements. It is understood that other means may be used to implement block elements including the use of microprocessors and custom integrated circuits.

In the diagram of FIG. 3, the oscillator 21 generates pulses that drive a transistor 60 on and off, turning on and off the IRLEDs 6 at the modulation frequency (typically 1 Khz). The infrared phototransistor 13 receives radiation from objects that reflect and scatter illumination from the IRLEDs 6 and produces a corresponding current proportional to the radiation that passes through its built-in infrared filter. Resistor 64 converts this current into a voltage which is applied to an operational amplifier 65 configured as a buffer (24 in FIG. 2). This buffered signal is filtered by a multiple feedback bandpass filter constructed of elements 66-70 (25 in FIG. 2). Operational amplifier 73 and resistors 71 and 72 amplify the filtered output of operational amplifier 70, making the filter operate at unity gain. Resistors 74 and 75 produce the center operating voltage for the bandpass filter, stabilized by capacitor 76.

An embodiment of a half wave rectifier is indicated at 26. Capacitor 77 AC couples the output of the bandpass filter 25, presenting to operational amplifier 81 a modulated signal centered around 0 volts. Diode 79 shorts the negative portion of the bandpassed signal, half wave rectifying the signal. Resistor 78 increases the impedance of the half wave rectifier, and resistor 80 provides a path to ground for operational amplifier 81.

The combination of resistor 82 and capacitor 83 and operational amplifier 85 filters the ripple of the half wave rectified signal, with resistor 84 providing a ground path for operational amplifier 85. A bias voltage from potentiometer 91 applied through resistor 90 to operational amplifier 88 is subtracted from the filtered signal 28 by the summing circuit created with operational amplifier 88. Resistors 86, 87, 89, and 90 are of equal value to produce a unity gain summer 30. Potentiometer 91 is adjusted to cancel any steady-state component of signal 28, thus serving as the bias signal 29 indicated in FIG. 2. Bias voltage exists at C.

The compensated signal 31 is amplified by operational amplifier 94, with the gain set by the ratio of the resistance of variable resistor 93 to resistor 92. The amplified signal 122 is buffered by operational amplifier 95 and ripple filtered by the RC combination of resistor 96 and capacitor 97, with resistor 98 providing a ground path for operational amplifier 100.

For calibration of the system, bicolored LED 145 illuminates green when current flows from operational amplifier 142 through current limiting resistor 144 into operational amplifier 143. This occurs when the proximity signal 28 is smaller than the bias voltage 141 at C in the diagram, driving the output of operational amplifier 142 high and operational amplifier 143 low, both configured as comparators. The bicolored LED 145 illuminates red when the current flows in the opposite direction, occurring when the proximity signal 28 is larger than the bias voltage 141. Calibration of the circuit and system can be performed by first setting the bias voltage 141 (via the potentiometer 91) to cause a zero summation when no finger or other object to be detected is present. The zero summation, or null state, is indicated when the bicolored LED 145 is off, i.e. neither green nor red. In practice it is possible for the bicolored LED 145 to alternate quickly from one color to the other while still in a null state, since the comparators 142 and 143 that drive the bicolored LED 145 do not include hysteresis, producing an apparent mixing of the two colors, typically perceived as orange, which is also an acceptable indication of a null state. Calibration is completed by adjusting the gain of the amplifier (32 in FIG. 2) via variable resistor 93, until a touch output at 50 is detected when a finger is placed in proximity to the touch switch.

The ripple filter output 35 is the proximity detection level (35 in FIG. 2) for the photoelectric proximity detector. If binary touch detection is desired, the detection level is compared by operational amplifier 103 to a detection reference (36 in FIG. 2) voltage formed by resistors 130 and 131, stabilized by capacitor 132. Resistor 102 provides positive feedback to operational amplifier 103, adding hysteresis to the comparator (37 in FIG. 2) for stability.

The system can be calibrated to read presence of touch at a desired distance from the detector device, by holding a finger at the desired distance and setting the gain of the amplifier (32 in FIG. 2) via variable resistor 93 to cause a position output at this position threshold.

The binary "touch" output 50 is buffered by a CMOS buffer 106, whose high output activates the time delay (38 of FIG. 2) by charging capacitor 109 through variable resistor 108. When the voltage on capacitor 109 exceeds the input level threshold of buffer 110, the output of buffer 110 goes high, turning on transistor 112 through resistor 111, turning on relay 40 which activates an electric device 43. Diode 115 clamps the negative voltage spike generated by relay 40 when its coil is deenergized. The time delay introduced by charging capacitor 109 is set by the value of the resistance of variable resistor 108. Diode 107 quickly discharges capacitor 109 as soon as the binary touch state 50 goes low, resetting the time delay (38 of FIG. 2).

Figure 4:
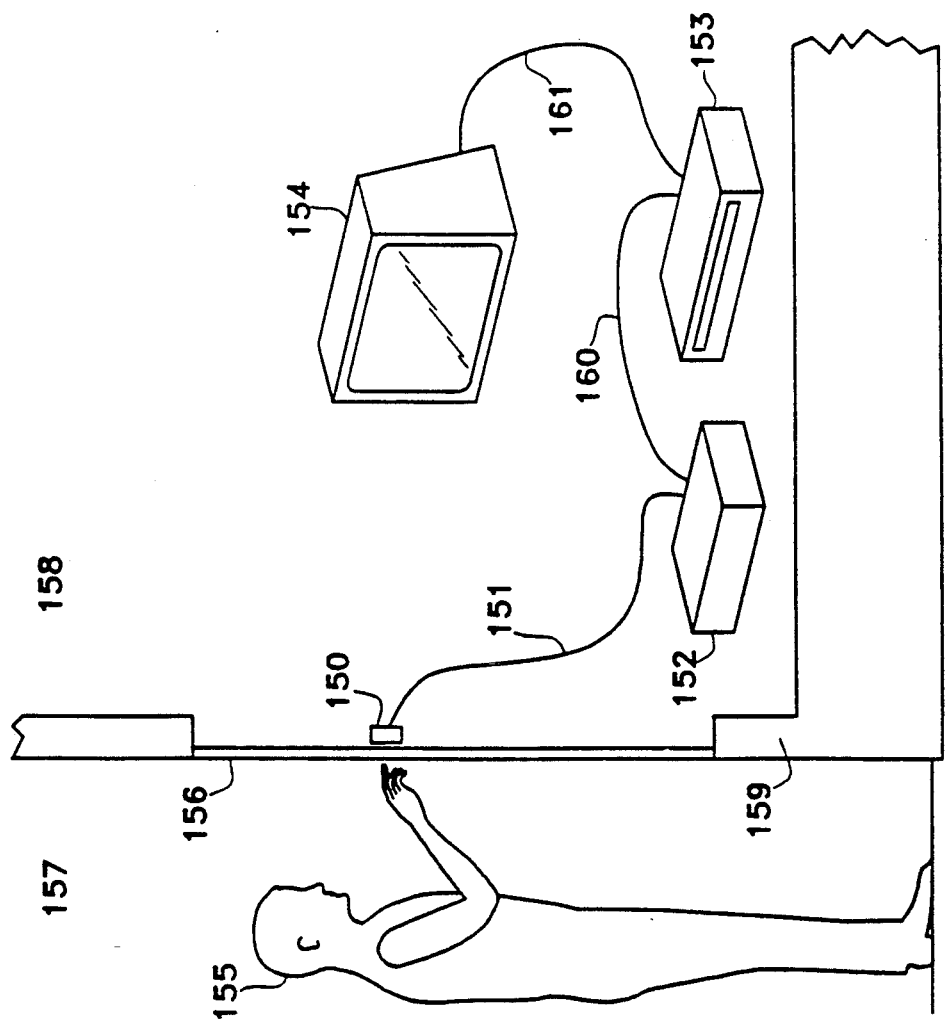
FIG. 4 is an elevation view in section showing an example of a system for enabling a user to control displays and other electrical items inside a store window, by touching the outside of the window glass to activate proximity detectors/switches of the invention mounted just inside the store window.

FIG. 4 shows a typical application of the photoelectric proximity system using a plurality of photoelectric proximity switches installed in a store window. All the system components (150-154, 160, 161) are located at the inside 158 of a window 156 (which may be single or multi-glazed), away from direct contact from the outside 157, eliminating the need for drilling holes through the building wall 159 or glass 156 and protecting the equipment from weather and vandals.

The IRLEDs (6 of FIG. 1A) and IRPTs (13 in FIG. 1A) of the photoelectric proximity switches (5 in FIG. 1A) are located in a touch panel 150, mounted on the inside of the glass pane window 156 and connected by a control cable 151 to a control unit 152 which contains the electronics of the photoelectric proximity switch.

Binary state outputs of the control unit 152, carried by cable 160, operate search and play functions of a video disk player 153 which displays a visual output on a monitor 154 though a cable 161. This electrical equipment is shown only as an example of display equipment. Other devices, for example toys, videotape movies, lamp fixtures, etc. can be operated and demonstrated to the user 155, through the user's own selections.

In operation, the person 155 outside the store touches the store window 156, coming within detection range of the photoelectric proximity switch panel 150, controlling, for example, the video disk player's search and play functions. The person could browse through a store's merchandise catalog, view houses listed with a realtor's office or vacation locations from a travel agent, preview video movies or view other information or electric products. Such display information can be stored on a video disk, but computer disk storage can alternatively be used for information and demonstrational displays.

Figure 5:
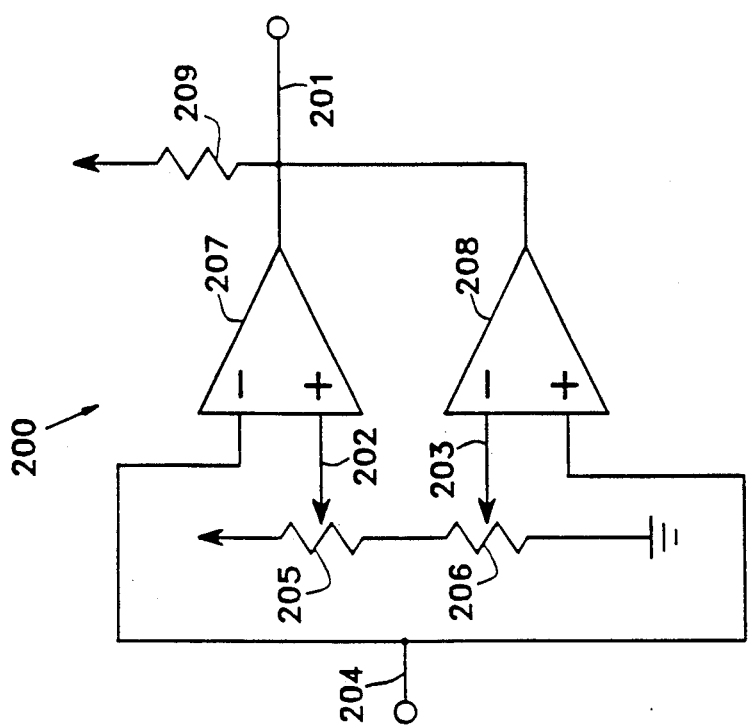
FIG. 5 is a schematic circuit diagram representing one embodiment of a dual threshold range comparator used in one embodiment of the invention to detect the presence of an object within a proximity zone.

FIG. 5 is a circuit schematic showing one possible implementation of a dual threshold range comparator 200 that can be used in place of, or in addition to the comparator 37 in FIG. 2 in order to indicate whether an object is inside a certain zone (neither too close nor too far). The comparator 200 produces a binary "in zone" and "out of zone" output 201 corresponding to a proximity level (35 in FIG. 2) value respectively being either within the bounds of two adjustable thresholds 202 and 203 or outside these thresholds. If the compensated proximity level 35 of FIG. 3 applied to comparison line 204 is greater than the upper threshold reference 202 set by potentiometer 205 or lower than the lower threshold reference 203 set by potentiometer 206, the open collector output of a comparator 207 or 208 respectively pulls the combined comparator output line 201 low. If the compensated proximity level 35 of FIG. 3 is lower than the upper threshold reference 202 and higher than the lower threshold reference 203, then the output of both comparator 207 and 208 are open, allowing output line 201 to be pulled high by resistor 209. A National Semiconductor LM339 is an example of an open collector comparator suitable for 207 and 208.

Figure 6:
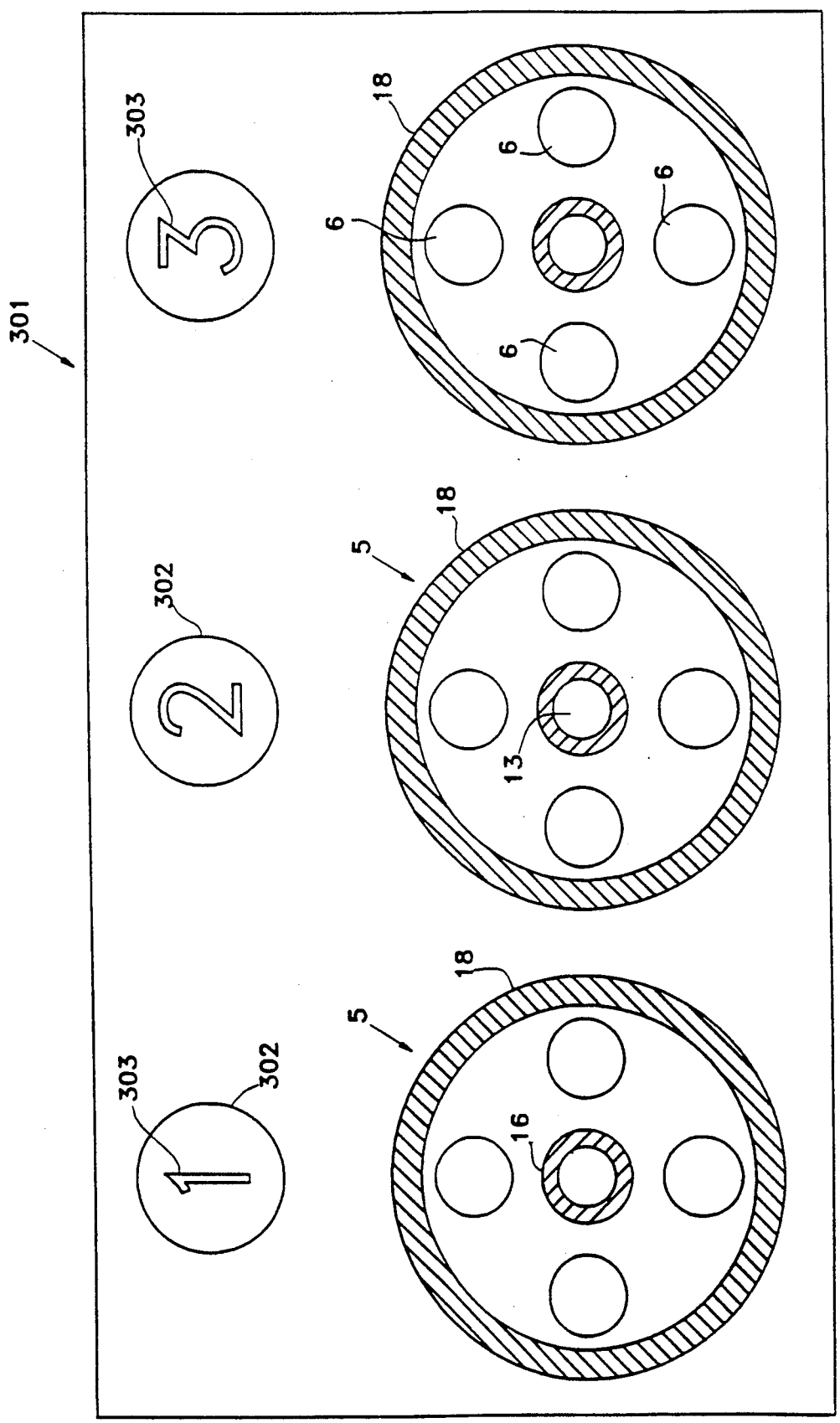
FIG. 6 is a front view of a touch panel containing three photoelectric proximity switches with illuminating target rings in accordance with the invention.
Figure 1A:
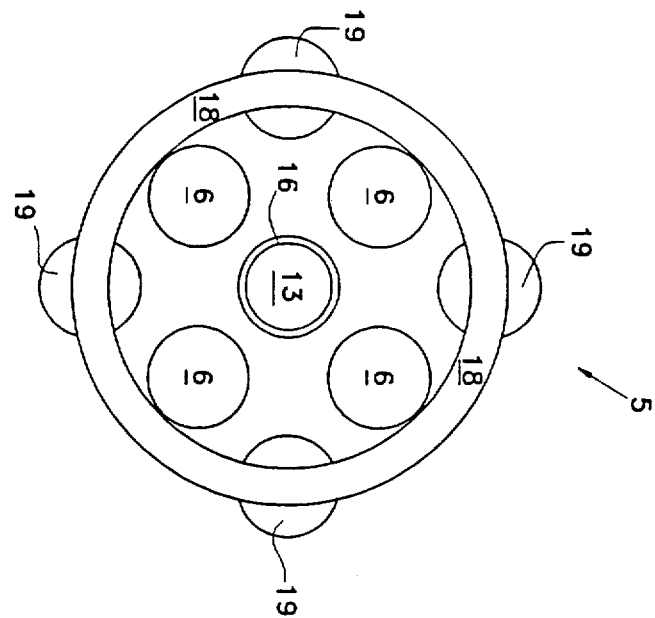
Figure 1B:
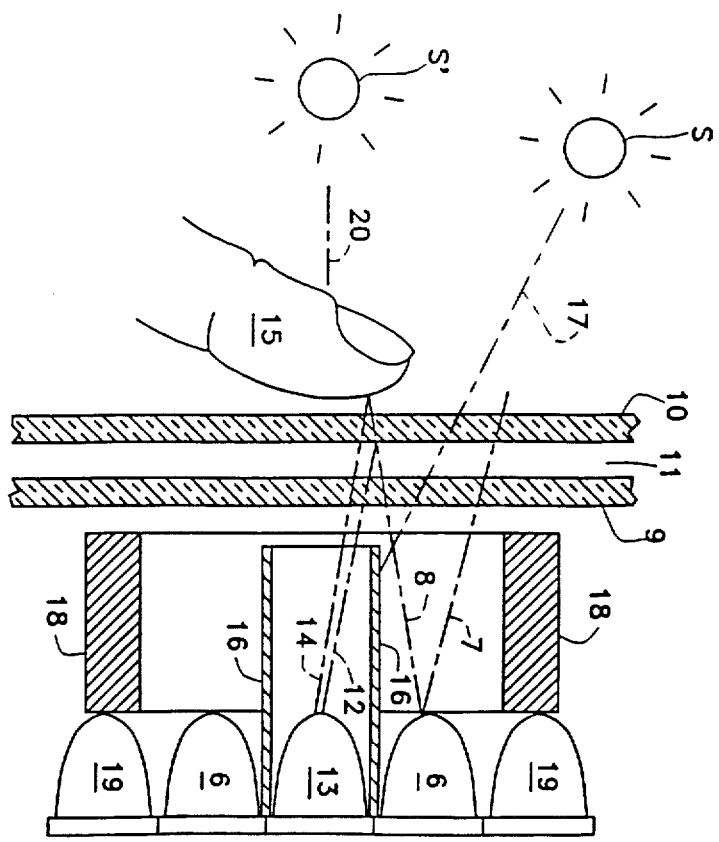
Figure 2:
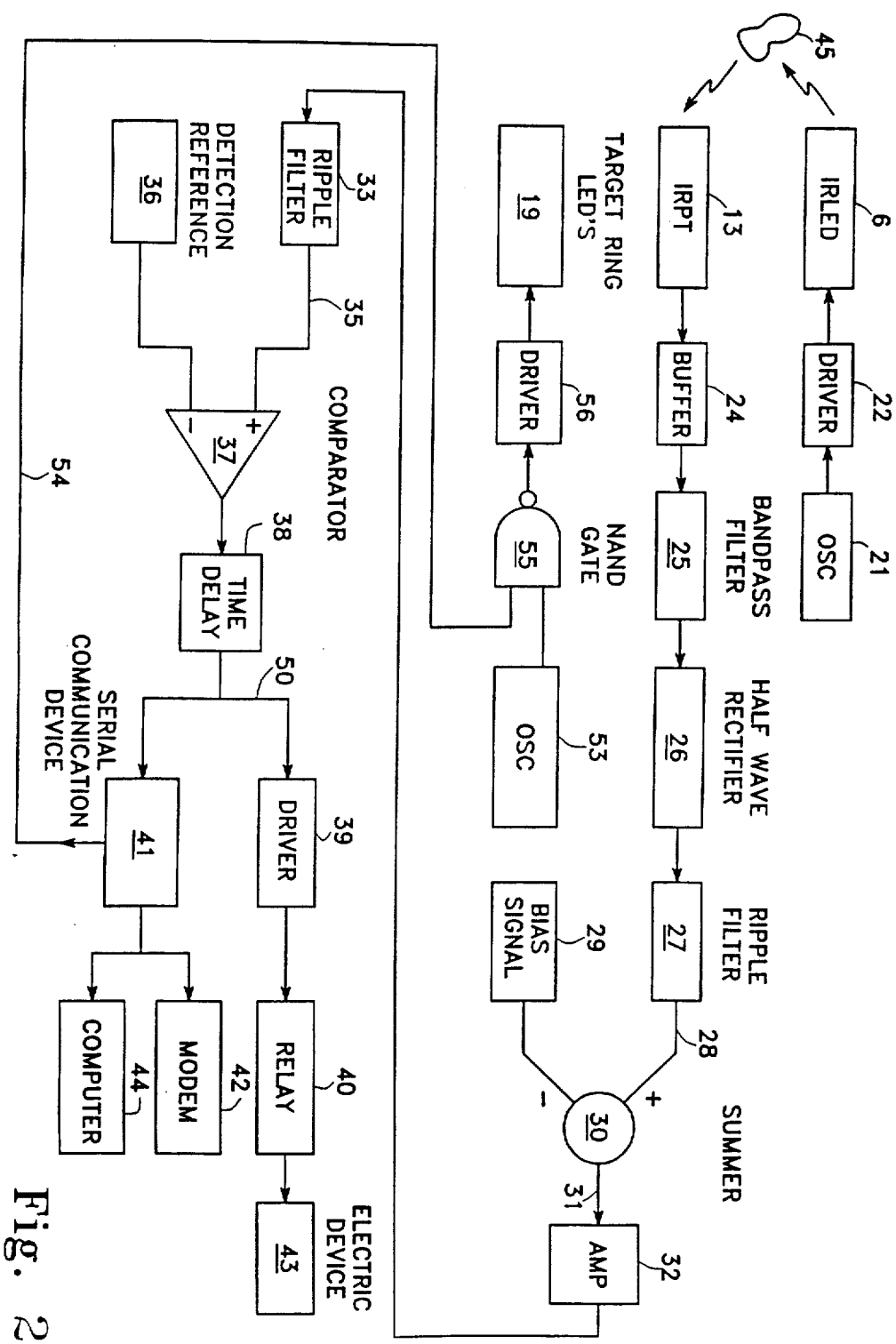
Figure 3:
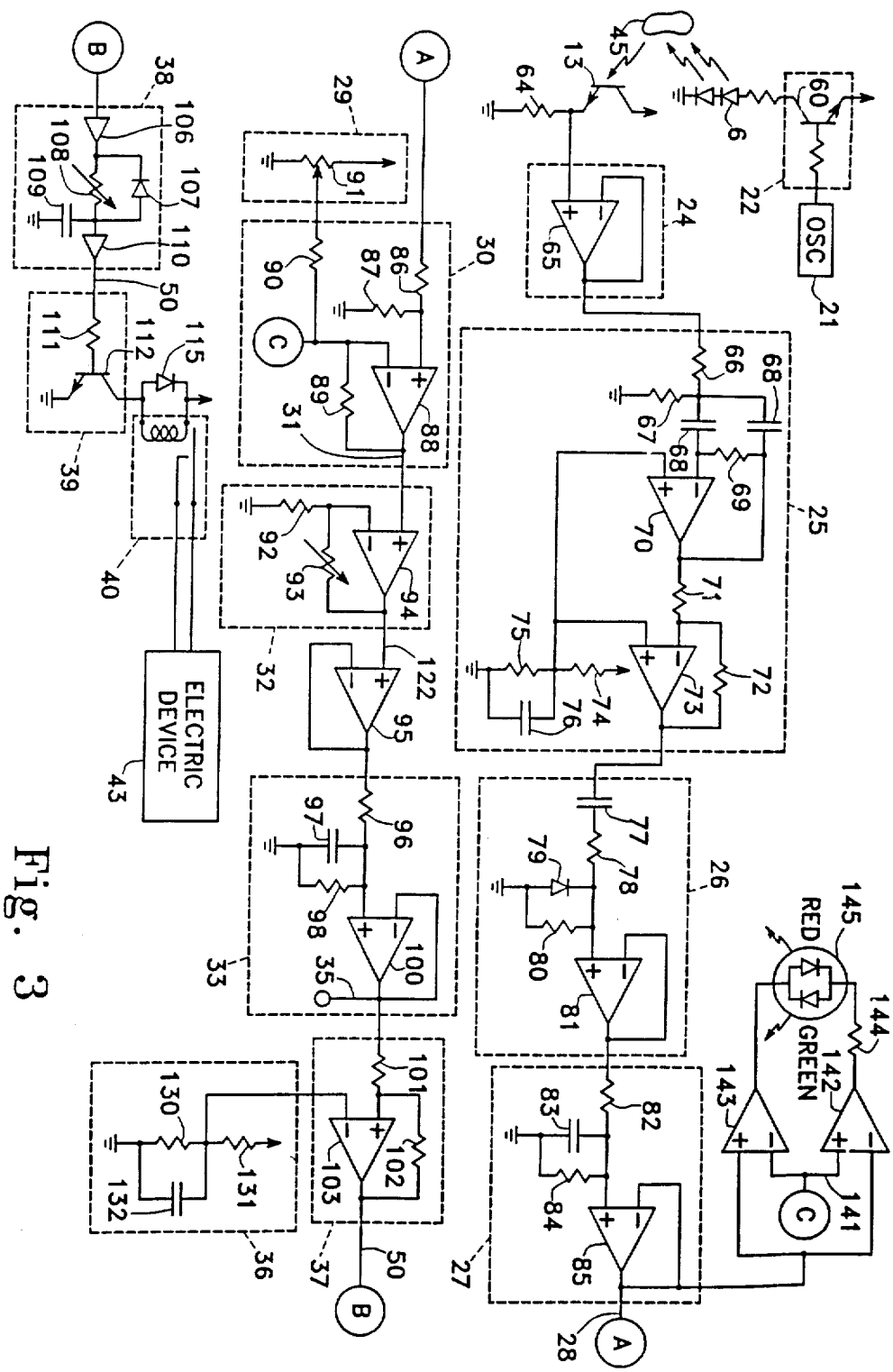

FIG. 6 is a front view of a touch panel 301 containing the optical components (5 in FIG. 1A) of three photoelectric proximity switches. Above each proximity switch 5 is a nomenclature indicator 302, which in one embodiment is a light conducting acrylic rod illuminated from the rear by an LED with an opaque label 303 adhered to the top surface of the nomenclature indicator 302, used to identify each switch 5. Illuminated target rings 18 indicate touch state of each switch 5, encircling the switch elements composed of a sheathed centrally located IRPT 13, surrounded by a cluster of four IRLEDs 6.

The following is a list of key components which may be used to implement the photoelectric proximity detector and switch as shown in the embodiment of FIG. 3.

| IRPT 63 | SFH 303F | Siemens |
|---|---|---|
| IRLED 61 | SFH 484 | Siemens |
| Oscillator 21 | LM555 | National Semiconductor |
| Operational amp. 65, 70, 73, 81, 85, 88, 94, 95, 100, 103, 142, 143 | LM324 | National Semiconductor |
| Buffer 106 | 74C902 | National Semiconductor |
| Transistor 112 | 2N2222 | Motorola |
| Transistor 60 | TIP106 | Texas Instruments |
| Bicolored LED | XC5491 | Senior Electronics, Taiwan |

As used herein and in the claims, the term "light" is intended to include infrared as well as the visible range of light. Other forms of light than infrared, i.e. light in the visible band, can be used for certain applications when desired. Further, although the invention is described as using light energy in the preferred embodiment, other forms of radiation and in fact non-radiation energy can be used, under the broad principles of the invention. For example, a system for proximity detection or switching which does not involve a glass barrier could use an ultrasonic form of energy to be reflected off objects desired to be detected, while still employing the principles of the invention particularly in regard to processing the reflected signal to a clean DC amplitude level before compensating for extraneous or background signal.

Although the preferred embodiment of the invention is described in terms of a proximity detecting device or a proximity switch or touch detector, it should be understood that the system of the invention is broadly applicable to numerous other situations such as in industrial applications, both as a proximity detector (measuring device), as a binary switch for indicating presence or non-presence of an object at a given proximity and as a zone detector for detecting whether an object is within a zone of proximity, neither too distant nor too near.

The above described preferred embodiment is intended to illustrate the principles of the invention, but not to limit its scope. Other embodiments and variations to this preferred embodiment will be apparent to those skilled in the art and may be made without departing from the spirit and scope of the invention as defined in the following claims.

I claim:

1. A detector for sensing proximity of objects within a sensing region, comprising, emitter means for emitting energy in a given gener direction in the sensing region, frequency modulation means for modulating the emitter means to produce a pulsed output at a selected frequency, detector means for receiving reflected energy emitted by the emitter means and reflected off an object positioned in the sensing region, and for producing an electrical signal having a frequency component matched to said selected frequency, signal processing means receiving the electrical signal from the detector means, for passing only a component of the electrical signal substantially at said selected frequency and for producing a processed signal which is representative of the amplitude of the electrical signal, and compensating means for subtracting from the amplitude of the processed signal a compensating value representing the magnitude of expected extraneous energy received by the detector means substantially at said selected frequency, and for producing a compensated signal, whereby the compensated signal may be used to determine whether an object is present in the sensing region, by applying a threshold or the amplitude of the compensated signal may be used to determine proximity of the object to the detector means.

2. Apparatus according to claim 1, wherein the compensated signal is used to determine whether or not an object is present in the sensing region, and the apparatus further including an amplifier for amplifying the compensated signal, ripple filter means for removing any remaining frequency component in the amplified compensated signal, and comparator means for comparing the resulting signal with a reference signal of preset value and for producing a binary state output.

3. Apparatus according to claim 1, further including indicator means for visually indicating the sign of the relative magnitude of the compensating value as compared to the processed signal, for use in calibrating the detector by adjusting the compensating value.

4. Apparatus according to claim 3, wherein the indicator means comprises a bicolored LED.

5. Apparatus according to claim 1, wherein the compensated signal is used to determine whether or not an object is present in the sensing region, with comparator means for comparing the amplitude of the compensated signal with a reference signal of preset value and for producing an object-present signal when appropriate, and further including time delay means for receiving the object-present signal and for producing a delayed object-present output after a selected time delay period, if and only if the object remains continuously present in the sensing region for the duration of the time delay period.

6. Apparatus according to claim 1, wherein the compensated signal is used to determine whether an object is present in the sensing region within a specific zone, excluding positions too distant or too close, and the detector further including dual threshold range comparison means receiving the compensated signal, for producing a binary state output indicating whether the object is within the specific zone as opposed to outside the zone in either direction.

7. A detector for sensing proximity of objects within a sensing region, comprising,
light emitter means for emitting light in a given general direction in the sensing region,
frequency modulation means for modulating the light emitter means to produce a pulsed output at a selected frequency,
detector means for receiving reflected light emitted by the light emitter means and reflected off an object positioned in the sensing region, and for producing an electrical signal having a frequency component matched to said selected frequency,
signal processing means receiving the electrical signal from the detector means, for producing a processed signal which is representative of the amplitude of said frequency component of the electrical signal, and
compensating means for subtracting from the amplitude of the processed signal a compensating value representing the magnitude of expected extraneous light received by the detector means substantially at said selected frequency, and for producing a compensated signal,
whereby the compensated signal may be used to determine whether an object is present in the sensing region, by applying a threshold, or the amplitude of the compensated signal may be used to determine proximity of the object to the detector means.

8. Apparatus according to claim 7, wherein the detector is on one side of a transparent divider such as a glass window having a plurality of reflecting surfaces, and wherein the compensating means includes means for subtracting a value including the magnitude of a constant level of reflection from the reflecting surfaces, of the emitted light onto the detector means, representing a constant extraneous level of signal at the selected frequency.

9. Apparatus according to claim 8, further including sheath means surrounding the detector means, for limiting the light received by the detector means to reflected light substantially approaching the detector means from an axis of the detector means.

10. Apparatus according to claim 8, wherein the light emitter means comprises an infrared light emitting diode.

11. Apparatus according to claim 8, further including threshold means for further processing the compensated signal to determine whether the compensated signal is sufficient to indicate the presence of an object in the sensing region, and for producing an object-present signal when appropriate, and wherein the threshold means is preset to produce the object-present signal only when an object is substantially touching the transparent divider opposite the detector.

12. Apparatus according to claim 7, wherein the compensated signal is used to determine whether or not an object is present in the sensing region, with comparator means for comparing the amplitude of the compensated signal with a reference signal of preset value and for producing an object-present signal when appropriate, and further including time delay means for receiving the object-present signal and for producing a delayed object-present output after a selected time delay period, if and only if the object remains continuously present in the sensing region for the duration of the time delay period.

13. Apparatus according to claim 7, wherein the compensated signal is used to determine whether an object is present in the sensing region within a specific zone, excluding positions too distant or too close, and the detector further including dual threshold range comparison means receiving the compensated signal, for producing a binary state output indicating whether the object is within the specific zone as opposed to outside the zone in either direction.

14. Apparatus according to claim 7, further including indicator means for visually indicating the sign of the relative magnitude of the compensating value as compared to the processed signal, for use in calibrating the detector by adjusting the compensating value.

15. Apparatus according to claim 14, wherein the indicator means comprises a bicolored LED.

16. Apparatus according to claim 7, wherein the compensated signal is used to determine whether or not an object is present in the sensing region, and the apparatus further including an amplifier for amplifying the compensated signal, ripple filter means for removing any remaining frequency component in the amplified compensated signal, and comparator means for comparing the resulting signal with a reference signal of preset value and for producing a binary state output.

17. Apparatus according to claim 16, further including sheath means surrounding the detector means, for limiting the light received by the detector means to reflected light substantially approaching the detector means from an axis of the detector means.

18. A touch detector for activating circuitry behind a transparent divider such as a glass window positioned to make a division between an inside space and an outside space, so as to let a user select desired information or other visual materials to be displayed from behind the transparent divider, comprising, a touch area indicator adjacent to the inside surface of the transparent divider, indicating to a user a touch area to be touched for making selections, light emitter means adjacent to the touch area indicator at the inside of the transparent divider, for emitting light outwardly through the transparent divider, toward the touch area, frequency modulation means for modulating the light emitter means to produce a pulsed output at a selected frequency, light detector means adjacent to the light emitter means at the inside of the transparent divider, oriented toward the outside, for receiving reflected light emitted by the light emitter means and reflected off a finger when present in the touch area at the outside of the transparent divider, and for producing an electrical signal having a frequency component the same as said selected frequency when a finger is present at the touch area, signal processing means receiving the electrical signal from the light detector means, for producing a processed signal which is representative of the amplitude of said frequency component of the electrical signals when present, compensating means for subtracting from the amplitude of the processed signal a value representing the magnitude of expected extraneous light received by the detector means substantially at said selected frequency, said extraneous light comprising a substantially constant level of emitted light reflection from surfaces of the transparent divider, as a constant background level of signal at the selected frequency, and for producing a compensated signal, and threshold comparator means for further processing the compensated signal to apply a preselected threshold and to determine whether the compensated signal is sufficient to indicate the presence at the touch area of a finger reflecting the emitted light to the detector, and for producing a switching signal output when it is detected that a finger is present.

19. A touch detector for activating circuitry behind a transparent divider such as a glass window positioned to make a division between an inside space and an outside space, so as to let a user select desired information or other visual materials to be displayed from behind the transparent divider, comprising, a plurality of touch area targets defined by illuminated perimeters adjacent to the inside surface of the transparent divider, indicating to a user a touch area for touch selection using each of the touch area targets from the outside of the transparent divider, electrical means for sensing the presence of a finger or other object at the touch area at the outside of the transparent divider, and means associated with the electrical means for causing the illumination perimeters of the touch area targets to continuously illuminate when the touch detector is not being used, and for causing the illuminated perimeter to flash on and off when a touch detector is to be used, and for causing the illuminated perimeter of a touch area target to continue flashing upon the sensing of a finger or other object at the touch area for that touch area target, and for other touch area targets to cease flashing and be in a mode of continuous illumination.

20. A touch detector according to claim 19, further including multiple choice selection means associated with the electrical means, for permitting a user to select through a series of menus indicated on a display means at the inside of the transparent divider and visible to the user from the outside of the transparent divider, each menu indicating to the user that a certain touch area target should be touched if a particular selection is to be made.

21. A method for sensing touch by a user at a touch area at the outside of a transparent divider, without breaching the integrity of the transparent divider, comprising, providing a touch detector apparatus adjacent to the inside surface of the transparent divider, emitting light, modulated at a selected frequency to produce a pulsed beam, from the touch detector apparatus through the transparent divider, toward the touch area, sensing modulated light thus emitted and reflected back from the touch area, using a photodetector means of the touch detector apparatus, producing an electrical signal from the photodetector means, having a frequency component the same as the selected frequency at which the emitted light is modulated, processing the electrical signal from the photodetector means to produce a processed signal which is representative of the amplitude of the frequency component of the electrical signal, without modulation, subtracting from the amplitude of the processed signal a value representing the magnitude of expected extraneous steady-state light received by the photodetector means substantially at the selected frequency, thereby producing a compensated signal, and making a comparison of the compensated signal with a reference value representative of a selected threshold indicative of the presence of a finger at the touch area, and producing a binary state output to indicate a touch when appropriate.

22. The method of claim 21, further including designating the touch area for a user at the outside of the transparent divider, by a touch area designating means at the inside of the transparent divider.

23. The method of claim 22, wherein the designating step is accomplished by illuminating a target ring at the inside of the transparent divider, circumscribing the touch area.

24. The method of claim 21, further including shielding the photodetector means from off-axis light, thus limiting the light received by the photodetector means to reflected light substantially approaching the photodetector means from an axis of the photodetector means.

25. The method of claim 24, wherein the shielding step is accomplished by positioning a tubular opaque sheath between the photodetector means and the inside surface of the transparent divider, centered substantially on the touch area and on the photodetector means.

26. The method of claim 21, wherein the emitted light is infrared.

27. The method of claim 26, wherein the light is emitted by an array of infrared LEDs, positioned peripherally around the touch area and around the photodetector means.

28. A method for sensing proximity of an object at a sensing region at the outside of a transparent divider, without breaching the integrity of the transparent divider, comprising,
   providing a detector apparatus adjacent to the inside surface of the transparent divider,
   emitting radiation, modulated at a selected frequency to produce a pulsed beam, from the detector apparatus through the transparent divider, toward the sensing region,
   sensing modulated radiation thus emitted and reflected back from the sensing region, using a detector means of the detector apparatus,
   producing an electrical signal from the detector means, having a frequency component the same as the selected frequency at which the emitted radiation is modulated,
   processing the electrical signal from the detector means to produce a processed signal which is representative of the amplitude of the frequency component of the electrical signal, without modulation, and
   subtracting from the amplitude of the processed signal a value representing the magnitude of expected extraneous steady-state radiation received by the detector means substantially at the selected frequency, thereby producing a compensated signal having an amplitude representing proximity of an object present in the sensing region,
   whereby the compensated signal may be compared with a reference value representative of a selected threshold indicative of the presence of an object in the sensing region so as to produce a binary state output to indicate the presence of an object when appropriate, or the amplitude of the compensated signal may be used to measure proximity of such an object in the sensing region.

* * * * *

UNITED STATES PATENT AND TRADEMARK OFFICE
CERTIFICATE OF CORRECTION

PATENT NO. : 5,103,085

DATED : April 7, 1992

INVENTOR(S) : Zimmerman

It is certified that error appears in the above-identified patent and that said Letters Patent is hereby corrected as shown below:

Column 10, line 44:

Correct "gener" to read --general--.

UNITED STATES PATENT AND TRADEMARK OFFICE
CERTIFICATE OF CORRECTION

PATENT NO. : 5,103,085

DATED : April 7, 1992

INVENTOR(S) : Zimmerman

Page 2 of 5

It is certified that error appears in the above-identified patent and that said Letters Patent is hereby corrected as shown below:

The sheet of drawings consisting of Figures 1B, 2 and 3, should be added as shown on the attached page.

Signed and Sealed this

Sixteenth Day of November, 1993

Attest:

BRUCE LEHMAN

Attesting Officer

Commissioner of Patents and Trademarks